(12) United States Patent
Halbert et al.

(10) Patent No.: US 9,390,785 B2
(45) Date of Patent: Jul. 12, 2016

(54) METHOD, APPARATUS AND SYSTEM FOR DETERMINING A WRITE RECOVERY TIME OF A MEMORY BASED ON TEMPERATURE

(71) Applicants: John B. Halbert, Beaverton, OR (US); Kuljit S. Bains, Olympia, WA (US)

(72) Inventors: John B. Halbert, Beaverton, OR (US); Kuljit S. Bains, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 25 days.

(21) Appl. No.: 14/227,969

(22) Filed: Mar. 27, 2014

(65) Prior Publication Data

US 2015/0279446 A1 Oct. 1, 2015

(51) Int. Cl.
*G11C 11/4076* (2006.01)
*G11C 11/4094* (2006.01)
*G11C 7/04* (2006.01)
*G11C 11/406* (2006.01)

(52) U.S. Cl.
CPC ............ *G11C 11/4076* (2013.01); *G11C 7/04* (2013.01); *G11C 11/4094* (2013.01); *G11C 11/40626* (2013.01)

(58) Field of Classification Search
CPC ... G11C 7/12; G11C 11/4094; G11C 11/4076
USPC ................................................ 365/203, 189.2
See application file for complete search history.

(56) References Cited

U.S. PATENT DOCUMENTS

| 7,221,609 | B1 | 5/2007 | Bains |
| 7,454,586 | B2 | 11/2008 | Shi et al. |
| 2003/0142557 | A1 | 7/2003 | Khandekar et al. |
| 2005/0018507 | A1* | 1/2005 | Schroder et al. ............... 365/203 |
| 2006/0236027 | A1 | 10/2006 | Jain et al. |
| 2012/0144106 | A1 | 6/2012 | Bains |
| 2012/0249218 | A1 | 10/2012 | Shoemaker |
| 2013/0346684 | A1 | 12/2013 | Bains |
| 2014/0359242 | A1* | 12/2014 | Son et al. ........................ 711/167 |

\* cited by examiner

*Primary Examiner* — Alexander Sofocleous
*Assistant Examiner* — Alfredo Bermudez Lozada
(74) *Attorney, Agent, or Firm* — Blakely, Sokoloff, Taylor & Zafman LLP (57) ABSTRACT

Techniques and mechanisms for determining a write recovery time of a memory device. In an embodiment, thermal detection logic detects a signal from a thermal sensor indicating a temperature state of a resource of the memory device. A value of a write recovery parameter is set based on the signal from the thermal sensor. In another embodiment, command logic generates a signal to precharge one or more cells of the memory device. The write recovery parameter is used by timer logic to control a timing of the signal to precharge the one or more cells.

18 Claims, 7 Drawing Sheets

MPR Page 2 information 400

| Address | MPR Location | A[7] | A[6] | A[5] | A[4] | A[3] | A[2] | A[1] | A[0] |
|---|---|---|---|---|---|---|---|---|---|
| BA1:BA0 | 00 = MPR0 | RFU | RFU | RFU | Temp Sensor Status | | CRC WE | Rtt_WR | |

MPR0 thermal state information 410

| A[4] | A[3] | Refresh Rate Range |
|---|---|---|
| 0 | 0 | Sub 1x refresh (> tREFI) |
| 0 | 1 | 1x refresh (= tREFI) |
| 1 | 0 | 2x refresh (1/2 tREFI) |
| 1 | 1 | rsvd |

FIG. 4A

TC-tWR values 420

| | MPR2 Page2 [A4:A3]=00 (tWR_cold) | MPR2 Page2 [A4:A3]=01 (tWR_hot) |
|---|---|---|
| tWR-75 | 75 ns | 60 ns or 45 ns |
| tWR-60 | 60 ns | 45 ns or 30 ns |
| tWR-45 | 45 ns | 30 ns |
| tWR-30 | 30 ns | <30 ns |

MR0 configuration information 430

| Address | Operating Mode | Description |
|---|---|---|
| A[13:12] | TC-tWR | Temperature controlled WR |
| A[11:9] | WR and RTP | Write recovery and Read to Auto-Precharge |

TC-tWR mode settings (MR0) 440

| A[13] | A[12] | TC-tWR |
|---|---|---|
| 0 | 0 | Disabled – always use tWR_cold for WR |
| 0 | 1 | Enabled – use tWR_cold for WR |
| 1 | 0 | Enabled – use tWR_hot for WR |
| 1 | 1 | rsvd |

MPR0 WR/RTP values 450

| A[11] | A[10] | A[9] | WR | RTP |
|---|---|---|---|---|
| 0 | 0 | 0 | 10 | 5 |
| 0 | 0 | 1 | 12 | 6 |
| 0 | 1 | 0 | 14 | 7 |
| 0 | 1 | 1 | 16 | 8 |
| 1 | 0 | 0 | 18 | 9 |
| 1 | 0 | 1 | 20 | 10 |
| 1 | 1 | 0 | 24 | 12 |
| 1 | 1 | 1 | rsvd | rsvd |

MPR Page3 WR multiplier (cold) 460

| A[5] | A[4] | A[3] | Multiplier |
|---|---|---|---|
| 1 | 1 | x | RFU |
| 1 | 0 | 1 | RFU |
| 1 | 0 | 0 | WR cold 5x |
| 0 | 1 | 1 | WR cold 4x |
| 0 | 1 | 0 | WR cold 3x |
| 0 | 0 | 1 | WR cold 2x |
| 0 | 0 | 0 | WR cold 1x |

MPR Page3 WR multiplier (hot) 470

| A[4] | A[3] | Multiplier |
|---|---|---|
| 1 | 1 | WR hot 4x |
| 1 | 0 | WR hot 3x |
| 0 | 1 | WR hot 2x |
| 0 | 0 | WR hot 1x |

METHOD, APPARATUS AND SYSTEM FOR DETERMINING A WRITE RECOVERY TIME OF A MEMORY BASED ON TEMPERATURE

BACKGROUND

1. Technical Field

The present invention relates generally to memory systems and more particularly, but not exclusively, to write recovery times of a volatile memory device.

2. Background Art

In the area of memories, dynamic random access memories (DRAMs) typically perform as the main memory of a computer system. That is, in a typical computer system, such as a desk top personal computer (PC), the main memory function is performed by DRAM devices. The operation of a DRAM is generally utilized with a processor, such as a central processing unit of a computer, but in other instances, the DRAM may be used with other processing/controlling devices, such as memory controllers.

In order to provide much higher performance in faster computer systems, higher performance requirements are also placed on DRAMs to process data in much larger quantities and in much faster performance time. Thus, it is not uncommon to find DRAMs configured into banks of DRAM arrays, in which data transfer to and from the DRAM arrays are achieved by high data speed bursts. For example, a high-speed 256 mega bit (Mb) DRAM, arranged in multiple banks, may be clocked to provide data transfer with an issuance of a read and/or write access command. It is also generally understood that DRAM devices utilize a precharge function. Precharging a DRAM generally refers to an operation that charges the bit lines to a preselected value. An auto-precharge condition automatically precharges the bit lines in response to an issuance of a command, such as a read or write command. That is, in some instances a read or write command may initiate an auto-precharge of the accessed bit lines prior to performing the read or the write function. With most DRAMs, the precharge or auto-precharge function typically has a signal sent from a processor or controller to the DRAM device in order to perform the precharging operation.

A write recovery parameter (tWR) represents a time required to store data into a DRAM (or other) cell before a subsequent precharge of the cell can take place. DRAMs historically have allowed 15 ns for tWR. However, with DRAM technology scaling to below 20 nm, tWR is expected to increase by three to five times current values—e.g. due to increased resistance in a path to a DRAM cell though data lines, sense amplifier circuitry, bit lines in the array, etc. Such increases in tWR will impact future CPU performance. For example, a 5% or more decrease in processor performance in server systems may be expected for a three time increase in tWR.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and mechanisms to determine a write recovery time of a memory device. Certain embodiment exploit a realization that temperature may be a basis for realizing opportunities—not recognized in previous technologies—to improve precharge timing. For example, techniques and mechanisms discussed herein variously identify that memory circuitry being comparatively hot may allow for a tWR value to be relatively small (whereas the memory circuitry being comparatively cold would require the tWR value to be relatively large). This temperature-dependent opportunity for a smaller tWR may be due, for example, to lower temperatures resulting in a higher threshold voltage Vt of an access transistor for a memory cell. For brevity, such determining of a tWR parameter value based on memory device temperature is referred to herein as temperature controlled write recovery (or TC-tWR).

A memory system according to an embodiment may track temperature of a DRAM chip or other such memory component, and adjust precharge timing on-the-fly as memory circuitry warms up. Consequently, the memory system may have better performance (shorter write recover time) at hotter temperatures (where the system would normally be warm or hot during normal operation) as compared to that at relatively colder temperatures when the system is first booting up. Moreover, certain embodiments variously provide for tWR adjustment which is compatible with already existing mechanisms, such as those of a dual data rate (DDR) specification, which allow for a memory device auto-precharge—i.e., to internally generate its own precharge signaling independent of an additional explicit precharge command from a memory controller.

Figure 1A:
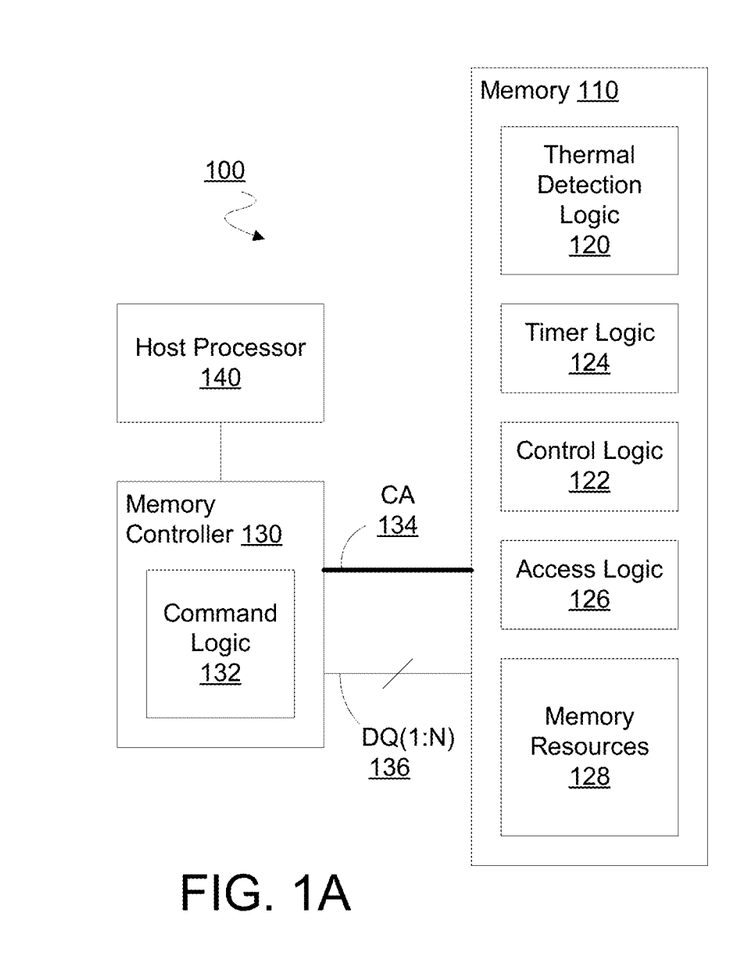
FIGS. 1A, 1B are block diagrams each illustrating elements of a respective system to provide access to a memory according to a corresponding embodiment.

FIG. 1A illustrates elements of a system 100 for controlling the timing of precharge operations according to an embodiment. System 100 may include memory device 110 coupled to memory controller 130—e.g. where memory controller 130 is to provide access to memory device 110 for a host processor 140 which is included in or coupled to system 100.

Memory device 110 may include any of a variety of types of memory technology that, for example, have rows of memory cells, where data is accessible via a wordline or the equivalent. In one embodiment, memory device 110 includes dynamic random access memory (DRAM) technology. Memory device 110 may be an integrated circuit (IC) die, a packaged device and/or a memory component within a larger memory (not shown) of system 100. For example, memory device 110 may be a DRAM device of a memory module such as a dual in-line memory module (DIMM).

Memory device 110 may include memory resources 128, which represent one or more logical and/or physical groups of memory. An example of one such grouping of memory is a bank of memory resources which, for example, may include an array of storage elements arranged in rows and columns. Memory device 110 may include access logic 126 to facilitate, at least in part, access to memory resources 128—e.g. where such access is provided for servicing one or more commands from memory controller 130. Access logic 126 may include, or operate in conjunction with, logic of memory device 110 which provides resource access according to conventional techniques—e.g. where functionality of thermal detection logic 120, control logic 122 and/or access logic 126 supplements such conventional techniques with additional functionality discussed herein. By way of illustration and not limitation, access logic 126 may include or couple to column logic and/or row logic (not shown) which are used to decode an access instruction to the proper memory location within memory resources 128.

Memory controller 130 may send commands or instructions to memory device 110 over one or more buses, as represented by the illustrative command/address (CA) bus 134. Such commands may be interpreted by memory device 110—e.g. including memory device 110 decoding command information to perform a variety of access functions within the memory and/or decoding address information with column logic and/or row logic. For example, such logic may access a specific location in memory resources 128 with a combination of a column address strobe or signal CAS and a row address strobe or signal RAS (not shown). Rows of memory may be implemented in accordance with known memory architectures or their derivatives. Briefly, a row of memory resources 128 may include one or more addressable columns of memory cells, as identified by the CAS generated by column logic of memory 110. The rows may each be variously addressable via the RAS generated by row logic of memory 110.

Access to memory resources 128 may be for the purpose of writing data exchanged—and/or reading data to be exchanged—via a data bus coupled to I/O circuitry (not shown) of memory 110. For example, N data bus signal lines DQ(1:N) 136 may couple I/O circuitry of memory device 110 to memory controller 130 and/or one or more other memory devices (not shown). In an embodiment, memory controller 130 includes command logic 132—e.g. comprising any of a variety of hardware logic and/or executing software logic—to send commands via CA 134. Command logic 132 may perform operations to generate, transmit or otherwise determine commands sent according to one or more conventional techniques. By way of illustration and not limitation, command logic 132 may provide command/address signaling functionality which, for example, conforms to some or all requirements of a dual data rate (DDR) specification such as the DDR3 Synchronous Dynamic Random Access Memory (SDRAM) Joint Electron Device Engineering Council (JEDEC) Standard JESD79-3C, April 2008, the DDR4 SDRAM JEDEC Standard JESD79-4, September 2012, or the like.

Control logic 122 may detect a command, received via CA 134, which is operated on by access logic 126 to provide access to memory resources 128. Such access may include, for example, a memory write after which a subsequent precharge operation—e.g. an auto-precharge—may be expected. Based on such detection, control logic 122 may identify a need for precharge signaling to be generated locally at memory 110. For example, memory controller 130 may signal a write with auto-precharge—e.g. as provided according to techniques such as those of DDR3, DDR4 or the like. In response, control logic 122 may, subsequent to a write operation, signal access logic 126 to perform such a precharge operation independent of memory controller 130 providing any additional precharge command explicitly specifying such a precharge operation. In an embodiment, a timing of such precharge signaling by control logic 122 may be based on a thermal state of memory device 110.

For example, memory controller 130 may include timer logic 124 comprising circuitry configured to control timing for signaling by control logic 122. Timer logic 124 may control such timing to enforce one or more time delay parameters required for operation of memory 110. One such time delay parameter may be, for example, a tWR parameter which specifies or otherwise indicates a minimum time after a write operation before a precharge operation may be performed. In an embodiment, timer logic 124 includes or couples to logic which, based on one or more environmental and/or operational characteristics, may configure any of a variety of possible values for such a tWR parameter. For example, a value for tWR may be selected from a plurality of pre-determined values based on a temperature of memory device 110.

By way of illustration and not limitation, memory device 110 may include thermal detection logic 120 which includes or couples to a thermal sensor to sense a temperature of an integrated circuit die, package or other such element memory device 100. Alternatively or in addition, thermal detection logic 120 may include or couple to storage—e.g. including one or more mode registers—to store information generated based on such thermal sensing. For example, such information may specify or otherwise indicate a temperature state sensed by such a thermal sensor. In an embodiment, thermal detection logic 120 accesses such information to detect whether (or not) a sensed temperature is within a given temperature range—e.g. whether the temperature is at, above, below some threshold level. Such information may indirectly indicate a temperature of memory device 110—e.g. wherein the information specifies a refresh rate or other operational parameter which is configured based on a thermal state of the memory device.

Figure 1B:
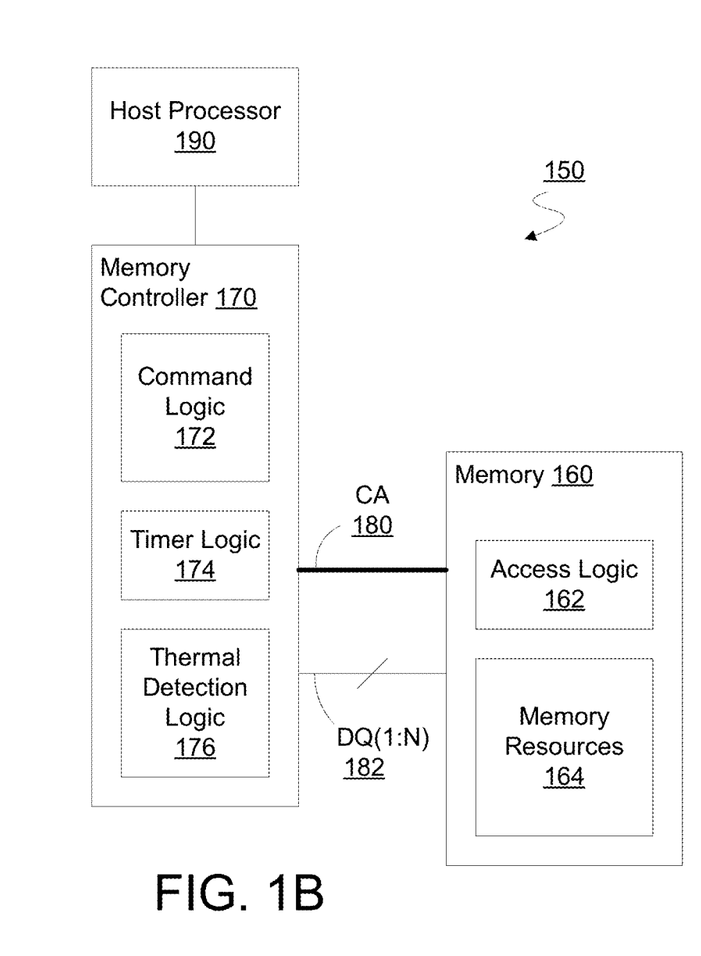

FIG. 1B illustrates elements of a system 150 to control a timing of precharge operations according to another embodiment. System 150 may include a memory device 160 and a memory controller 170 having, for example, some or all of the features of memory device 110 and memory controller 130, respectively. For example, memory device 160 may include memory resources 164 and access logic 162 which provide functionality corresponding to that of memory resources 128 and access logic 126, respectively. In an embodiment, access to memory device 160 is provided by memory controller 170 to a host processor 190 (or other agent) which is included in or coupled to system 150.

Memory controller 170 may send commands to memory device 160 over one or more buses—as represented by the illustrative command/address (CA) bus 180—to write to memory resources 164 (and/or read from memory resources 164) data which, for example, is exchanged via N data bus signal lines DQ(1:N) 182. Command logic 172 of memory controller 170 may provide, for example, a write command after which a subsequent precharge operation may be expected. In such an embodiment, command logic 172 may subsequently send to memory 160 an explicit precharge command for access logic 162 to precharge one or more memory cells of memory resources 164. In an embodiment, a timing of such a precharge comment by command logic 172 may be based on a thermal state of memory device 160.

For example, memory controller 170 may include timer logic 174 comprising circuitry configured to control timing for an assertion (e.g. sending) of signaling by command logic 172. Timer logic 174 may control such timing to enforce one or more time delay parameters such as a tWR parameter. Timer logic 174 may include or couple to logic which, based on one or more environmental and/or operational characteristics, configures any of a variety of possible values for such a tWR parameter. For example, thermal detection logic 176 of memory controller 170 may receive information from memory device 160 (or any of various other sources) specifying or otherwise indicating a thermal state of memory 160. Based on such information, timer logic 174 may control when a precharge command from command logic 172 may be sent via CA 180.

Figure 2:
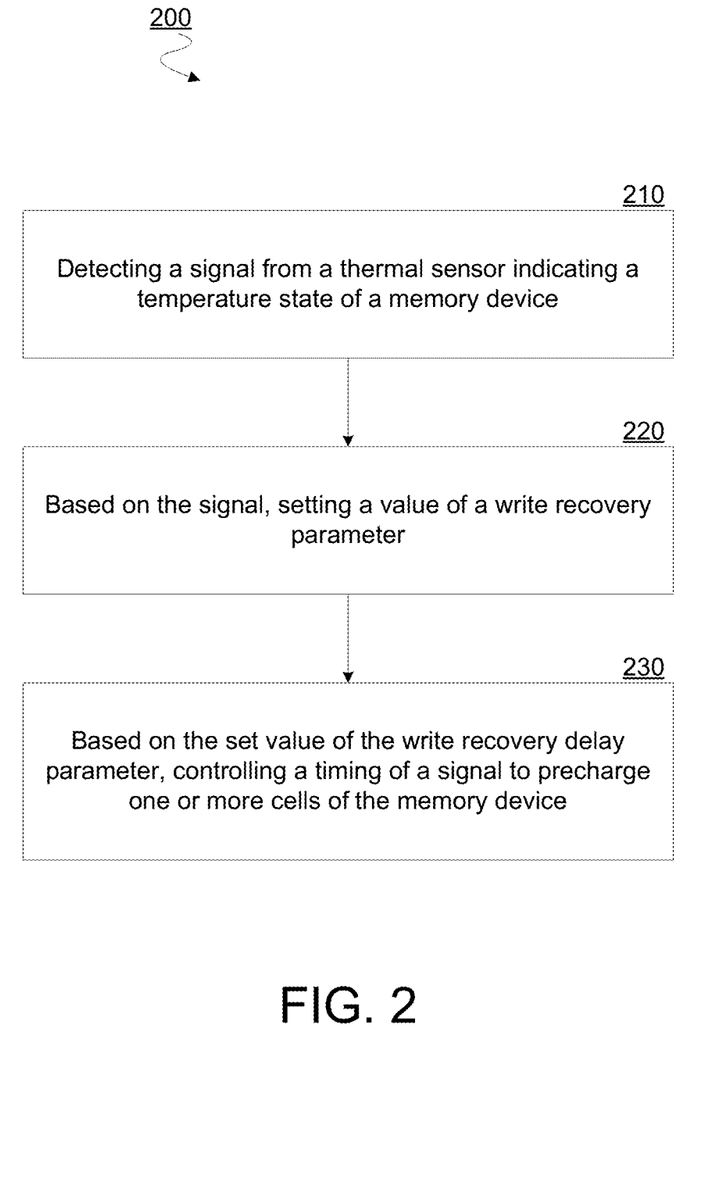
FIG. 2 is a flow diagram illustrating elements of a method for accessing a memory according to an embodiment.

FIG. 2 illustrates elements of a method 200 for accessing a memory according to an embodiment. Method 200 may be performed, for example, by a memory device—such as memory device 110 or memory 160—to locally determine timing of an auto-precharge operation independent of any explicit precharge command from a memory controller. Alternatively or in addition, method 200 may be performed by a memory controller—e.g. one of memory controllers 130, 170—to determine when to send such an explicit precharge command to a memory device. In an embodiment, method 200 provides for precharging of one or more memory locations such as in memory resources 128 or in memory resources 164.

Method 200 may include, at 210, detecting a signal from a thermal sensor indicating a temperature state of a memory device. For example, an IC chip, package or other element of a memory may include microelectromechanical system (MEMS) or other such structures to sense a temperature of the memory element. Such structures may be adapted from any of a variety of conventional thermal sensing mechanisms, which are not detailed herein to avoid obscuring features of certain embodiments. Certain embodiments may not be limited with respect to a particular mechanism for sensing thermal state of a memory. In one embodiment, the detecting at 210 includes circuit logic of the memory device polling or otherwise receiving an output from such a thermal sensor—e.g. where, in response, such circuit logic updates state information of the memory device. In another embodiment, the detecting at 210 includes a memory controller reading such state information from the memory device.

Method 200 may further comprise, at 220, setting a value of a write recovery parameter based on the signal. For example, method 200 may access configuration or other state information—in a mode register or other repository—that is based on the indicated temperature state. By way of illustration and not limitation, such configuration/state information may specify or otherwise indicate a temperature-dependent refresh mode of the memory device. In such an embodiment, the setting of the tWR value at 220 may include accessing the configuration information to select, look-up, calculate or otherwise determine a corresponding value for the write recovery parameter.

Based on the value of the write recovery parameter which is set at 220, method 200 may, at 230, control a timing of a signal to precharge one or more cells of the memory device. For example, the controlling at 230 may include the memory device detecting an expiration of a period of time subsequent to a write operation (the period of time based on the write recovery parameter) where, in response to such expiration, an auto-precharge may be generated or otherwise enabled for communication. In another embodiment, the controlling at 230 may include a memory controller detecting the expiration of such a period of time and, in response, generating or otherwise enabling communication of a precharge command from the memory controller to a memory device.

Figure 3:
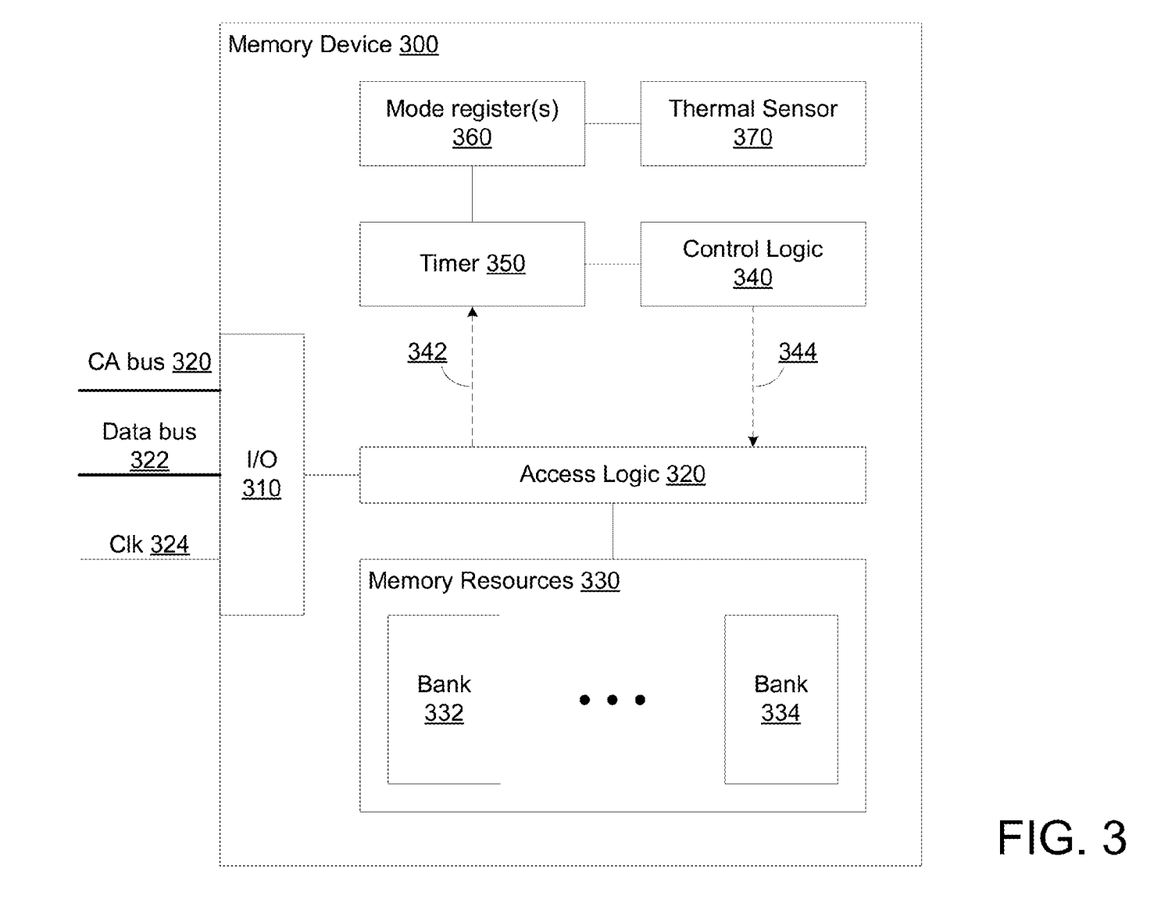
FIG. 3 is a block diagram illustrating elements of a memory device to perform a precharge operation according to an embodiment.

In FIG. 3, a more detailed illustration a memory device 300, such as one of memory devices 110, 160, is shown. That is, FIG. 3 illustrates one embodiment of a DRAM or other memory device that may perform precharge operations—e.g., according to method 200.

In the particular embodiment shown, memory device 300 comprises memory resources 330 including a plurality of banks 332, . . . , 334. It is appreciated that the actual number of such banks may vary with the design of the particular DRAM (or other) device. An internal data bus couples the banks 332, . . . , 334 to access logic 320 comprising, for example, circuitry to read from, write to, precharge or otherwise access memory cells of banks 332, . . . , 334. Read control circuitry of access logic 320 may control the transfer of the data from banks 332, . . . , 334 to a data bus 322—e.g. in response to a memory controller (not shown) communicating a read command via a CA bus 320 which is coupled to input/output hardware I/O 310 of memory device 300. Alternatively or in addition, write control circuitry of access logic 320 may control a data transfer from data bus 322 to a selected one of banks 332, . . . , 334 in response to the memory controller communicating a write command via CA bus 320. A clock signal CLK 324 input via I/O 310 may regulate timing for one or more operations of memory device—e.g. including a triggering of a data transfer onto/from the data bus 322. It is to be noted that a variety of components typically comprise circuitry implemented in read control circuitry and/or write control circuitry of access logic 320. Generally these components include various latches, registers, buffers, drivers, and/or multiplexers. The actual circuitry implemented is not critical to the understanding of certain embodiments.

In an embodiment, an auto-precharge operation may be signaled to access logic 320 based on a thermal state of memory device 300. By way of illustration and not limitation, memory device 300 may include a thermal sensor 370 to sense a temperature, rate of temperature change or other temperature state of memory device 300. Thermal sensor 370 may, for example, be incorporated into or otherwise coupled to sense a temperature of memory resources 330. In response to an indication of thermal state from thermal sensor 370, a repository of state information—as represented by the illustrative one or more mode registers 360—may be updated to specify or otherwise indicate the sensed thermal state. Such state information may be subsequently accessed as a reference for determining timing for a signal to perform an auto-precharge of one or more memory cells of banks 332, . . . , 334.

For example, a timer 350 of memory device 300 may be coupled to receive an indication 342 of a write operation performed (or to be performed) by access logic 320. Timer 350 may set or otherwise determine—e.g. prior to or in response to indication 342—a value for a write recovery parameter tWR. The value of tWR may include or otherwise be based on the configuration information in mode register(s) 360 which, in turn, is based on the temperature state indicated by thermal sensor 370. In response to the indication 342, timer 350 may toll the passing of a predetermined time period—e.g. based on Clk 324 and the value of tWR. Based on such tolling, timer 350 may provide to control logic 340 a signal indicating an expiration of the period of time—subsequent to a write operation to access banks 332, . . . , 334—which is based on the value of tWR. In response to the period of time expiring, control logic 340 may send to access logic a signal 344 which is to serve functionally as a precharge command generated locally by memory device 300—i.e., independent of any corresponding explicit precharge command from the memory controller.

Figure 4A:
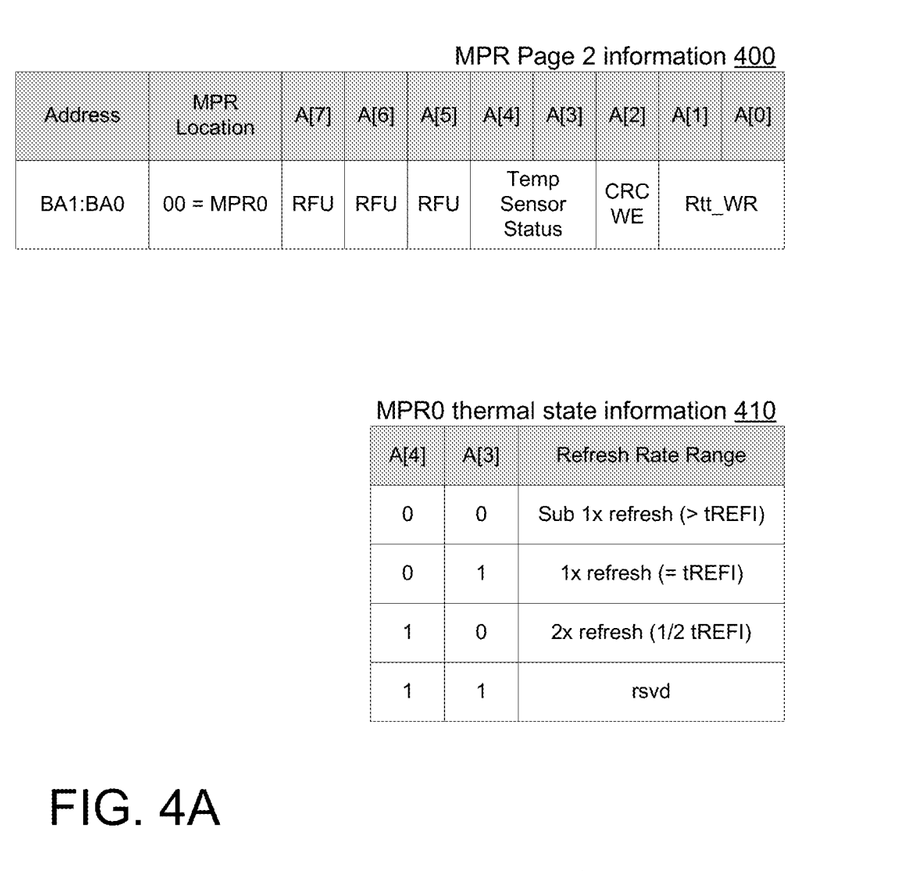
FIGS. 4A, 4B illustrate state information accessed to determine a memory precharge operation to be performed according to an embodiment.
Figure 4B:
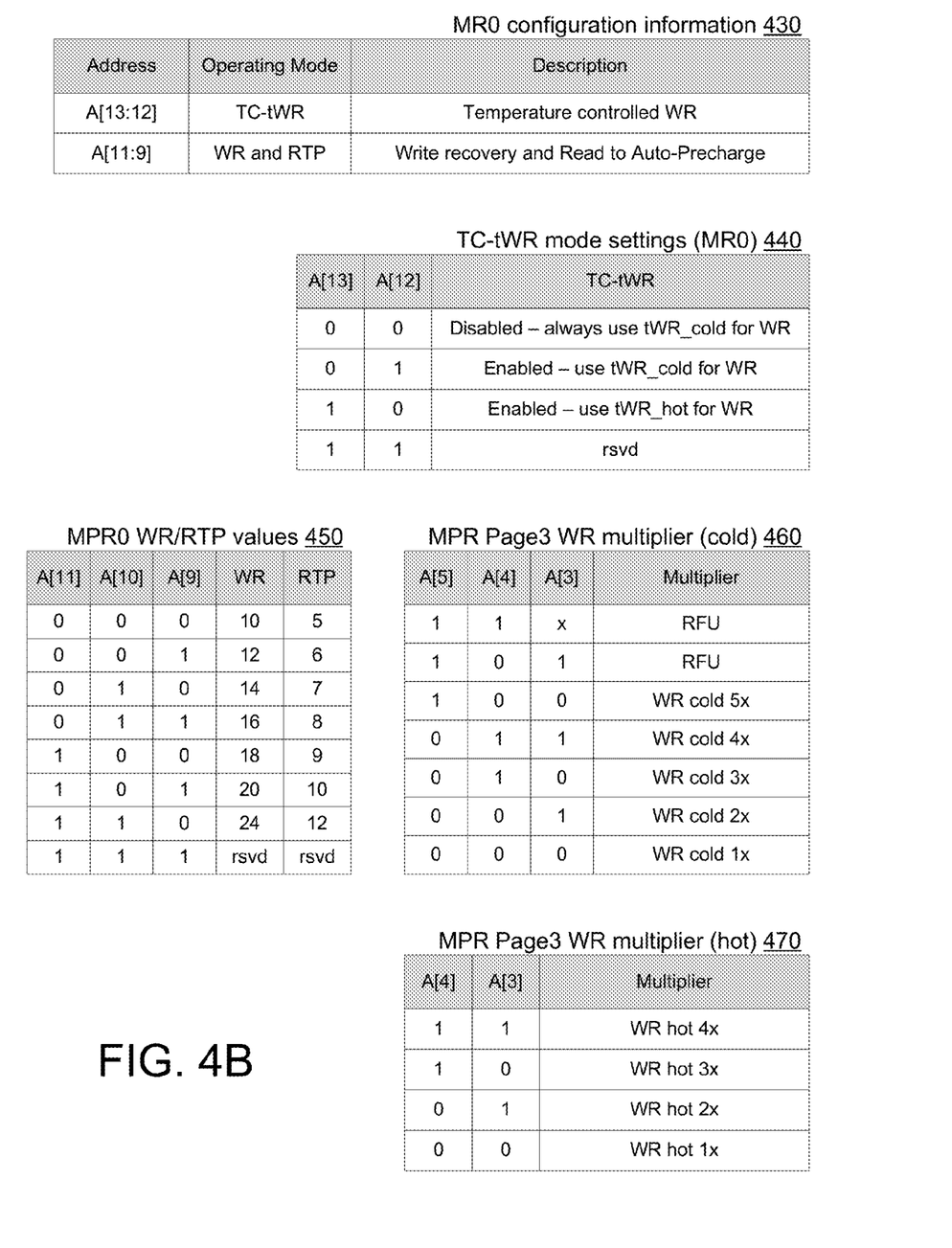

FIGS. 4A, 4B illustrate various state information which, in an embodiment, may be available for access to determine the timing of memory precharge operations. Such state information may be accessed during operations of method 200, for example. In one embodiment, the state information shown in FIGS. 4A, 4B includes information stored in a state information repository such as mode register(s) 360. To illustrate features of certain embodiments, FIGS. 4A, 4B show information which is stored according to techniques and/or formats which are compatible with requirements of the DDR4 specification. However, it is understood that any of a variety of additional or alternative configuration information may, in different embodiments, be similarly stored according to other techniques and/or formats.

FIG. 4A shows a table 400 representing a portion of information which is included in the multi-purpose register (MPR) Page2 as set forth in the DDR4 specification. Table 400 illustrates one example of how temperature state information, generated based on operation of a thermal sensor, may be stored for later access to determine a value for a tWR parameter. More particularly, the DDR4 specification states that two bits A[4]:A[3] of MPR Page 2 information 400 are to store temperature sensor status information. Other information represented in table 400—e.g. regarding cyclic redundancy check (CRC), write enable (WE) termination resistor (Rtt) and/or other functionality—is shown only for context, and may not be limiting on certain embodiments.

As shown in table 410, the DDR4 specification associates various values for bits A[4]:A[3] each with a respective memory refresh rate—e.g. where the refresh rate corresponds, for example, to a refresh interval parameter tREFI. Certain embodiments extend the utility of these bits A[4]:A[3] to additionally or alternatively associate certain values for bits A[4]:A[3] each with a respective value for a write recovery parameter tWR. As shown in table 420, different values for tWR may be specified for different values of A[4]:A[3]—e.g., wherein the two columns of table 420 correspond, respectively, to a relatively long parameter value (tWR_cold) for a comparatively cold temperature state, and to a relatively short parameter value (tWR_hot) for a comparatively hot temperature state. As illustrated by various rows of table 420, different values for tWR may be further specified for different classes of memory devices (as represented by the illustrative device classifications tWR-75, tWR-60, tWR-45, tWR-30), although certain embodiments are not limited in this regard As illustrated in table 430 of FIG. 4B, mode register bits may be adapted in certain embodiments to selectively specify whether (or not) temperature controlled write recovery is currently enabled. By way of illustration and not limitation, the two-bits A[13]:A[12] of mode register MR0, which are reserved for use (RFU) according to the DDR4 specification, may be adapted to store information indicating whether and/or how temperature controlled write recovery is to be implemented. For example, table 440 illustrates one example of how values for A[13]:A[12] may variously specify enablement/disablement of temperature controlled write recovery. For example, in a disable mode (e.g., A[13]:A[12] equal to '00'), a DRAM may always use a tWR_cold value for timing an autoprecharge operation. In an enabled mode (e.g., A[13]:A[12] equal to one of '01' or '01'), the DRAM may use either a tWR_cold value or a tWR_hot value, respectively, depending on a DRAM die temperature or other such thermal state indicated by MPR Page 2 A[4:3].

In certain embodiments, a relatively hot temperature state of a memory device may provide an opportunity to avail of a shorter write recovery value tWR_hot. However, a memory device—or alternatively, a memory controller—may be selectively configured to forego (or not forego) such an opportunity. For example, such a memory device may nevertheless continue to operate with a longer write recovery value such as tWR_cold. By contrast, a relatively cold temperature state of the memory device may preclude use of tWR_hot—e.g. where use of tWR_cold is instead required.

Tables 450, 460, 470 illustrate an additional or alternative mechanism for determining a value of a tWR parameter according to some embodiments. As shown in table 450, the DDR4 specification defines various write recovery (WR) values and read to precharge (RTP) values which may be defined with three bits A[11]:A[9] of MPR0—e.g. where such values are configured by a memory controller writing to A[11]:A[9]. Certain embodiments extend the utility of these bits A[11]:A[9] by further providing functionality to define tWR with respect to a multiplier of a WR value currently specified by A[11]:A[9]. By way of illustration and not limitation, DDR4 specifies that three bits A[5]:A[3] of MPR Page3 are available for vendor-specific use. In some embodiments, a write recovery parameter tWR_cold for a comparatively temperature state (and/or a similar parameter tWR_hot for a comparatively hot temperature state) may be defined in terms of a multiplier to be applied to—e.g. multiplied by—a currently configured WR value.

Figure 5:
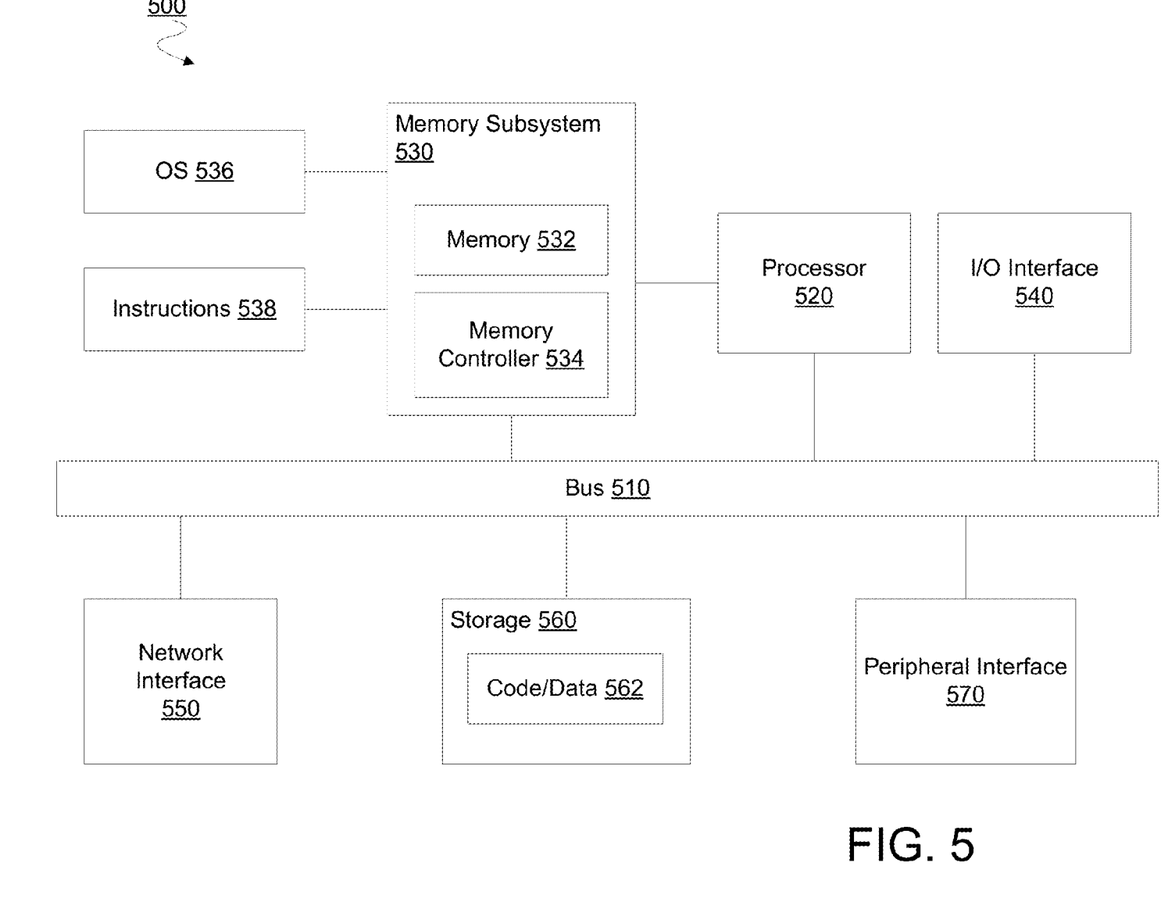
FIG. 5 is a block diagram illustrating elements of a computer system including a including a memory operated according to an embodiment.

FIG. 5 is a block diagram of an embodiment of a computing system in which memory accesses may be implemented. System 500 represents a computing device in accordance with any embodiment described herein, and may be a laptop computer, a desktop computer, a server, a gaming or entertainment control system, a scanner, copier, printer, or other electronic device. System 500 may include processor 520, which provides processing, operation management, and execution of instructions for system 500. Processor 520 may include any type of microprocessor, central processing unit (CPU), processing core, or other processing hardware to provide processing for system 500. Processor 520 controls the overall operation of system 500, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 may include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520.

Memory subsystem 530 may include memory device 532 where it stores data, instructions, programs, or other items. In one embodiment, memory subsystem includes memory controller 534, which is a memory controller in accordance with any embodiment described herein, and which provides mechanisms for accessing memory device 532. In one embodiment, memory controller 534 provides commands to access memory device 532.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 may include, for example, one or more of a system bus, a Peripheral Component Interconnect (PCI)

bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 may also correspond to interfaces in network interface 550.

System 500 may also include one or more input/output (I/O) interface(s) 540, network interface 550, one or more internal mass storage device(s) 560, and peripheral interface 570 coupled to bus 510. I/O interface 540 may include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 may include an Ethernet adapter, wireless interconnection components, USB (universal serial bus), or other wired or wireless standards-based or proprietary interfaces.

Storage 560 may be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 may be generically considered to be a "memory," although memory 530 is the executing or operating memory to provide instructions to processor 520. Whereas storage 560 is nonvolatile, memory 530 may include volatile memory (i.e., the value or state of the data is indeterminate if power is interrupted to system 500).

Peripheral interface 570 may include any hardware interface not specifically mentioned above. Peripherals refer generally to devices that connect dependently to system 500. A dependent connection is one where system 500 provides the software and/or hardware platform on which an operation executes, and with which a user interacts.

Figure 6:
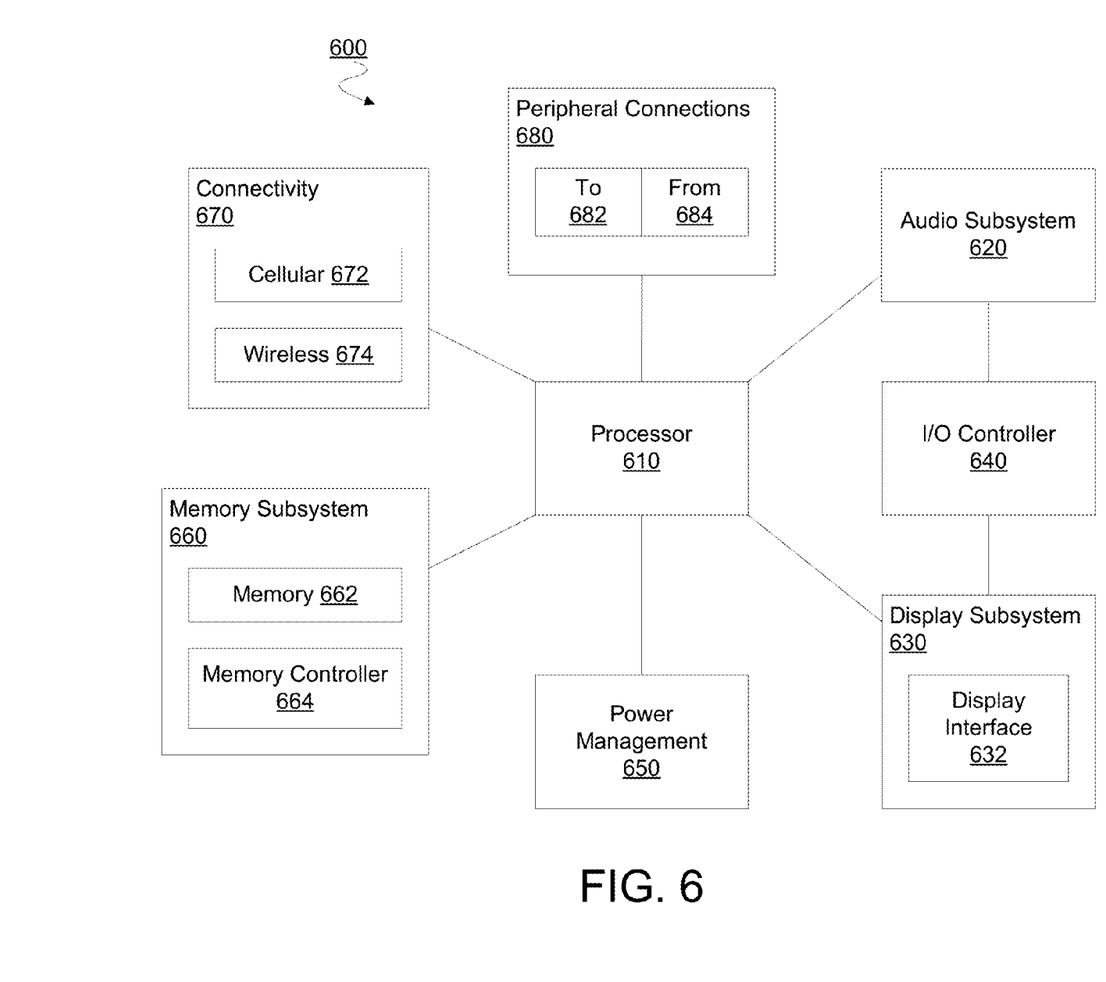
FIG. 6 is a block diagram illustrating elements of a mobile device including a memory operated according to an embodiment.

FIG. 6 is a block diagram of an embodiment of a mobile device in which memory accesses may be implemented. Device 600 represents a mobile computing device, such as a computing tablet, a mobile phone or smartphone, a wireless-enabled e-reader, or other mobile device. It will be understood that certain of the components are shown generally, and not all components of such a device are shown in device 600.

Device 600 may include processor 610, which performs the primary processing operations of device 600. Processor 610 may include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 may include display interface 632, which may include the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 may operate to manage hardware that is part of audio subsystem 620 and/or display subsystem 630. Additionally, I/O controller 640 illustrates a connection point for additional devices that connect to device 600 through which a user might interact with the system. For example, devices that may be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620 and/or display subsystem 630. For example, input through a microphone or other audio device may provide input or commands for one or more applications or functions of device 600. Additionally, audio output may be provided instead of or in addition to display output. In another example, if display subsystem includes a touchscreen, the display device also acts as an input device, which may be at least partially managed by I/O controller 640. There may also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that may be included in device 600. The input may be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 may include memory device(s) 662 for storing information in device 600. Memory subsystem 660 may include nonvolatile (state does not change if power to the memory device is interrupted) and/or volatile (state is indeterminate if power to the memory device is interrupted) memory devices. Memory 660 may store application data, user data, music, photos, documents, or other data, as well as system data (whether long-term or temporary) related to the execution of the applications and functions of system 600. In one embodiment, memory subsystem 660 includes memory controller 664 (which could also be considered part of the control of system 600, and could potentially be considered part of processor 610) to control memory 662.

Connectivity 670 may include hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 may include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector may allow device 600 to connect to certain peripherals that allow device 600 to control content output, for example, to audiovisual or other systems.

In addition to a proprietary docking connector or other proprietary connection hardware, device 600 may make peripheral connections 680 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one implementation, an apparatus comprises thermal detection logic to detect a signal from a thermal sensor, the signal indicating a first temperature state of a memory resource, and command logic to generate a signal to precharge one or more cells of the memory resource. The apparatus further comprises timer logic to set, based on the signal from the thermal sensor, a value of a write recovery parameter, the timer logic further to control, based on the set value of the write recovery parameter, a timing of the signal to precharge the one or more cells of the memory resource.

In an embodiment, the apparatus further comprises the memory resource and input/output hardware to couple the apparatus to a memory controller, wherein the timer logic is to control the timing of the signal to precharge the one or more cells in response to a write command received at the apparatus from the memory controller. In another embodiment, the apparatus further comprises the memory resources and access logic, wherein the command logic to generate the signal to precharge the one or more cells includes the command logic to send an auto-precharge signal to the access logic. In another embodiment, the command logic to generate the signal to precharge the one or more cells includes the command logic to send a precharge command to a memory device coupled to the apparatus. In another embodiment, the timer logic to set the value of the write recovery parameter includes the timer logic to select from a plurality of values including a first value corresponding to a first temperature and a second value corresponding to a second temperature higher than the first temperature, wherein the second value is less than the first value. In another embodiment, the timer logic to set the value of the write recovery parameter includes the timer logic to determine a multiplier value to apply to a configured write recovery time value.

In another implementation, a method comprises detecting a signal from a thermal sensor, the signal indicating a first temperature state of a memory resource, based on the signal, setting a value of a write recovery parameter, and based on the set value of the write recovery parameter, controlling a timing of a signal to precharge one or more cells of the memory resource.

In an embodiment, controlling the timing of the signal to precharge the one or more cells is in response to a write command received from a memory controller. In another embodiment, the signal to precharge the one or more cells includes an auto-precharge signal. In another embodiment, the method further comprises sending the signal to precharge the one or more cells as a precharge command from a memory controller to a memory device. In another embodiment, setting the value of the write recovery parameter includes selecting from a plurality of values including a first value corresponding to a first temperature and a second value corresponding to a second temperature higher than the first temperature, wherein the second value is less than the first value. In another embodiment, setting the value of the write recovery parameter includes determining a multiplier value to apply to a configured write recovery time value.

In another implementation, a computer-readable storage medium having stored thereon instructions which, when executed by one or more processing units, cause the one or more processing units to perform a method comprises detecting a signal from a thermal sensor, the signal indicating a first temperature state of a memory resource, based on the signal, setting a value of a write recovery parameter, and based on the set value of the write recovery parameter, controlling a timing of a signal to precharge one or more cells of the memory resource.

In an embodiment, controlling the timing of the signal to precharge the one or more cells is in response to a write command received from a memory controller. In another embodiment, the signal to precharge the one or more cells includes an auto-precharge signal. In another embodiment, the method further comprises sending the signal to precharge the one or more cells as a precharge command from a memory controller to a memory device. In another embodiment, setting the value of the write recovery parameter includes selecting from a plurality of values including a first value corresponding to a first temperature and a second value corresponding to a second temperature higher than the first temperature, wherein the second value is less than the first value. In another embodiment, setting the value of the write recovery parameter includes determining a multiplier value to apply to a configured write recovery time value.

In another implementation, a system comprises a memory controller, a data bus and a memory device coupled to the memory controller via the data bus. The memory device includes a memory resource including memory cells, thermal detection logic to detect a signal from a thermal sensor, the signal indicating a first temperature state of the memory resource, command logic to generate a signal to precharge one or more cells of the memory resource, and timer logic to set, based on the signal from the thermal sensor, a value of a write recovery parameter, the timer logic further to control, based on the set value of the write recovery parameter, a timing of the signal to precharge one or more of the memory cells.

In an embodiment, the timer logic is to control the timing of the signal to precharge the one or more cells in response to a write command received at the memory device from the memory controller. In another embodiment, the command logic to generate the signal to precharge the one or more cells includes the command logic to send an auto-precharge signal to the access logic. In another embodiment, the timer logic to set the value of the write recovery parameter includes the timer logic to select from a plurality of values including a first value corresponding to a first temperature and a second value corresponding to a second temperature higher than the first temperature, wherein the second value is less than the first value. In another embodiment, the timer logic to set the value of the write recovery parameter includes the timer logic to determine a multiplier value to apply to a configured write recovery time value.

Techniques and architectures for operating a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:
1. An apparatus comprising:
   thermal detection logic to detect a signal from a thermal sensor, the signal indicating a first temperature state of a memory resource;
   command logic to generate a signal to precharge one or more cells of the memory resource; and
   timer logic to set, based on the signal from the thermal sensor, a value of a write recovery parameter, including the timer logic to determine a multiplier value to apply to a configured write recovery time value, the timer logic further to control, based on the set value of the write recovery parameter, a timing of the signal to precharge the one or more cells of the memory resource.
2. The apparatus of claim 1, further comprising the memory resource and input/output hardware to couple the apparatus to a memory controller, wherein the timer logic to control the timing of the signal to precharge the one or more cells in response to a write command received at the apparatus from the memory controller.
3. The apparatus of claim 1, further comprising the memory resources and access logic, wherein the command logic to generate the signal to precharge the one or more cells includes the command logic to send an auto-precharge signal to the access logic.
4. The apparatus of claim 1, wherein the command logic to generate the signal to precharge the one or more cells includes the command logic to send a precharge command to a memory device coupled to the apparatus.
5. The apparatus of claim 1, wherein the timer logic to set the value of the write recovery parameter includes the timer logic to select from a plurality of values including:
   a first value corresponding to a first temperature; and a second value corresponding to a second temperature higher than the first temperature, wherein the second value is less than the first value.

6. A method comprising:
detecting a signal from a thermal sensor, the signal indicating a first temperature state of a memory resource;
based on the signal, setting a value of a write recovery parameter, including determining a multiplier value to apply to a configured write recovery time value; and
based on the set value of the write recovery parameter, controlling a timing of a signal to precharge one or more cells of the memory resource.

7. The method of claim 6, wherein controlling the timing of the signal to precharge the one or more cells is in response to a write command received from a memory controller.

8. The method of claim 6, wherein the signal to precharge the one or more cells includes an auto-precharge signal.

9. The method of claim 6, further comprising sending the signal to precharge the one or more cells as a precharge command from a memory controller to a memory device.

10. The method of claim 6, wherein setting the value of the write recovery parameter includes selecting from a plurality of values including:
a first value corresponding to a first temperature; and
a second value corresponding to a second temperature higher than the first temperature, wherein the second value is less than the first value.

11. A non-transitory computer-readable storage medium having stored thereon instructions which, when executed by one or more processing units, cause the one or more processing units to perform a method comprising:
detecting a signal from a thermal sensor, the signal indicating a first temperature state of a memory resource;
based on the signal, setting a value of a write recovery parameter, including determining a multiplier value to apply to a configured write recovery time value; and
based on the set value of the write recovery parameter, controlling a timing of a signal to precharge one or more cells of the memory resource.

12. The computer-readable storage medium of claim 11, wherein controlling the timing of the signal to precharge the one or more cells is in response to a write command received from a memory controller.

13. The computer-readable storage medium of claim 11, wherein the signal to precharge the one or more cells includes an auto-precharge signal.

14. The computer-readable storage medium of claim 11, the method further comprising sending the signal to precharge the one or more cells as a precharge command from a memory controller to a memory device.

15. The computer-readable storage medium of claim 11, wherein setting the value of the write recovery parameter includes selecting from a plurality of values including:
a first value corresponding to a first temperature; and
a second value corresponding to a second temperature higher than the first temperature, wherein the second value is less than the first value.

16. A system comprising:
a memory controller;
a data bus;
a memory device coupled to the memory controller via the data bus, the memory device including:
a memory resource including memory cells;
thermal detection logic to detect a signal from a thermal sensor, the signal indicating a first temperature state of the memory resource;
command logic to generate a signal to precharge one or more cells of the memory resource; and
timer logic to set, based on the signal from the thermal sensor, a value of a write recovery parameter, including the timer logic to determine a multiplier value to apply to a configured write recovery time value, the timer logic further to control, based on the set value of the write recovery parameter, a timing of the signal to precharge one or more of the memory cells.

17. The system of claim 16, wherein the timer logic to control the timing of the signal to precharge the one or more cells in response to a write command received at the memory device from the memory controller.

18. The system of claim 16, wherein the timer logic to set the value of the write recovery parameter includes the timer logic to select from a plurality of values including:
a first value corresponding to a first temperature; and
a second value corresponding to a second temperature higher than the first temperature, wherein the second value is less than the first value.

* * * * *